United States Patent
Ryu

(10) Patent No.: US 8,519,779 B2
(45) Date of Patent: Aug. 27, 2013

(54) SEMICONDUCTOR APPARATUS VOLTAGE SUPPLY CIRCUIT

(75) Inventor: Je Il Ryu, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 13/309,801

(22) Filed: Dec. 2, 2011

(65) Prior Publication Data

US 2012/0139622 A1 Jun. 7, 2012

(30) Foreign Application Priority Data

Dec. 3, 2010 (KR) .................. 10-2010-0122911

(51) Int. Cl.
*G05F 3/02* (2006.01)
(52) U.S. Cl.
USPC .......................................... 327/536
(58) Field of Classification Search
USPC .......................... 327/530, 534–537
See application file for complete search history.

(56) References Cited

U.S. PATENT DOCUMENTS

| 6,535,430 B2 * | 3/2003 | Ogura et al. ............. 365/185.23 |
| 7,005,912 B2 * | 2/2006 | Nonaka ........................ 327/536 |
| 7,439,795 B2 * | 10/2008 | Yanagigawa et al. ......... 327/536 |

FOREIGN PATENT DOCUMENTS

KR 100179852 B1 11/1998

* cited by examiner

*Primary Examiner* — Lincoln Donovan
*Assistant Examiner* — Sibin Chen
(74) *Attorney, Agent, or Firm* — William Park & Associates Patent Ltd.

(57) ABSTRACT

A voltage supply circuit includes, inter alia, a clock generator, a negative voltage pump, a level shifter, a clock controller, and a pump circuit. The clock generator generates a first clock swinging between a positive voltage and a ground voltage. The negative voltage pump generates a negative voltage. A level shifter shifts the first clock by the negative voltage to output a second clock swinging between the negative voltage and the ground voltage. The clock controller generates a third clock by inverting the second clock and also generates a fourth clock by inverting the third clock. The pump circuit generates a high voltage according to the third and fourth clocks.

8 Claims, 4 Drawing Sheets

SEMICONDUCTOR APPARATUS VOLTAGE SUPPLY CIRCUIT

CROSS-REFERENCE TO RELATED APPLICATION

Priority is claimed to Korean patent application number 10-2010-0122911 filed on Dec. 3, 2010, the entire disclosure of which is incorporated by reference herein.

BACKGROUND

An exemplary embodiment relates generally to a semiconductor apparatus, and more particularly to a voltage supply circuit and method of providing a high voltage in a semiconductor apparatus.

Nonvolatile memory devices such as electrically erasable and programmable flash memory devices perform erase operations for erasing data stored in memory cells and program operations for storing data in the memory cells taking advantage of the Fowler-Nordheim (F-N) tunneling and hot electron injection principles.

A flash memory device operates with a low power source voltage but also generates high voltage by having a voltage supply circuit for internally generating a high voltage within a chip. The voltage supply circuit in a flash memory device is configured to output a high voltage by pumping an input low voltage using a voltage pump circuit.

FIG. 1 shows a conventional voltage supply circuit 100 of a nonvolatile memory device.

Referring to FIG. 1, the voltage supply circuit 100 includes a clock generator 110 and a pump group 120.

The clock generator 110 generates a clock CLK in a pulse form ranging from a power source voltage VCC to a ground voltage VSS.

The clock CLK of the clock generator 110 is outputted as a first clock CK and a second clock CKb through first and second inverters A1 and B1 as shown in FIG. 1.

The first inverter A1 inverts the clock CLK and outputs the inverted signal as the first clock CK, and the second inverter B1 inverts the first clock CK and outputs the inverted signal as the second clock CKb. The first and second inverters A1 and B1 invert their respective input signals so that the inputted signals are pulled up or pulled down to the power source voltage VCC and the ground voltage VSS.

The first inverter A1 inverts the clock CLK and outputs the inverted clock as the first clock CK.

The first clock CK is inputted to the second inverter B1. The second inverter B1 inverts the first clock CK and outputs the inverted clock as the second clock CKb.

The pump group 120 includes a plurality of pump circuits such as the first to fourth pump circuits 121 to 124 as shown in FIG. 1.

The pump circuits 121 to 124 have same configuration. Each pump circuit pumps the inputted voltage in response to the first and second clock signals CK and CKb and outputs the pumped voltage.

The pump circuits 121 to 124 are connected in series so as to receive the output voltage of one pump circuit as an input voltage and to output an output voltage to the next pump circuit connected in series. For example, the first pump circuit 121 receives the power source voltage VCC as the input voltage, and each of the remaining pump circuits 122 to 124 receives the voltage outputted from the previous pump circuit as its input voltage. The pump circuits 121 to 124 perform pumping operations, because the first and second clock signals CK and CKb are received in a pulse form between the power source voltage VCC and the ground voltage VSS. That is, the pump circuits 121 to 124 perform the pumping operations according to the voltage difference dt of VCC between the first and second clock signals CK and CKb.

In the voltage supply circuit 100, the pump circuits 121 to 124 of the pump group 120 include respective capacitors (not shown). Furthermore, the capacitors of the pump circuits 121 to 124 are repeatedly charged and discharged in response to the first and second clock signals CK and CKb in order to pump voltage.

To charge and discharge the capacitors in the pump circuits 121 to 124, the first and second clock signals CK and CKb are repeatedly pulled up to the power source voltage VCC and pulled down to the ground voltage VSS.

The first and second inverters A1 and B1 pull up the first and second clock signals CK and CKb to the power source voltage VCC or pull down the first and second clock signals CK and CKb to the ground voltage VSS.

Most of the current consumed by the voltage supply circuit 100 is the current consumed while the first and second clock signals CK and CKb are pulled up or pulled down. That is, the first and second inverters A1 and B1 are responsible for most of the current consumed by the voltage supply circuit 100.

When more pump circuits (for example, the four pump circuits 121 to 124 shown in FIG. 1) are necessary to output a sufficiently high voltage by the pump circuit 120, the more capacitors are needed. Thus, the amount of current consumed to generate the first and second clock signals CK and CKb by the first and second inverters A1 and B1 will increase even more to charge and discharge an increased number of capacitors due to increased number of pump circuits in the pump circuit 120.

BRIEF SUMMARY

An exemplary embodiment relates to a voltage supply circuit and method which are capable of reducing consumption current by providing a circuit for reducing current consumption necessary to generate a clock signal.

A voltage supply circuit according to an aspect of the present invention includes a clock generator for generating a first clock swinging between a positive voltage and a ground voltage, a negative voltage pump for generating a negative voltage, a level shifter for generating a second clock, swinging between the negative voltage and the ground voltage, by shifting the first clock to the negative voltage, a first inverter for generating a third clock by inverting the second clock, a second inverter for generating a fourth clock by inverting the third clock, and a pump circuit for generating a high voltage according to the third and fourth clocks.

A voltage supply method according to another aspect of the present invention includes generating a first clock swinging between a power source voltage and a ground node, generating a second clock, swinging between a ground voltage and a negative voltage, and a third clock inverted from the second clock, by using the first clock, and outputting a pumped voltage by pumping an input voltage using the second and third clocks.

DESCRIPTION OF EMBODIMENT

Hereinafter, an exemplary embodiment of the present invention will be described in detail with reference to the accompanying drawings. The figures are provided to allow those having ordinary skill in the art to understand the scope of embodiments of the present invention.

Figure 1:
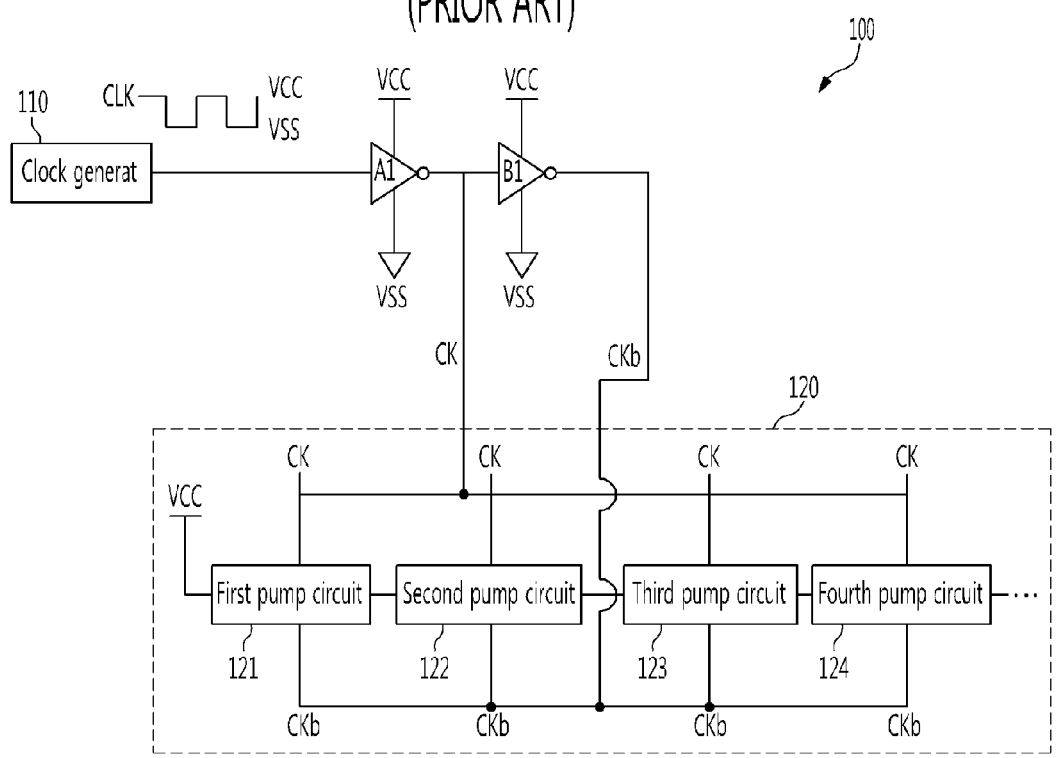
FIG. 1 shows the voltage supply circuit of a nonvolatile memory device.
Figure 2:
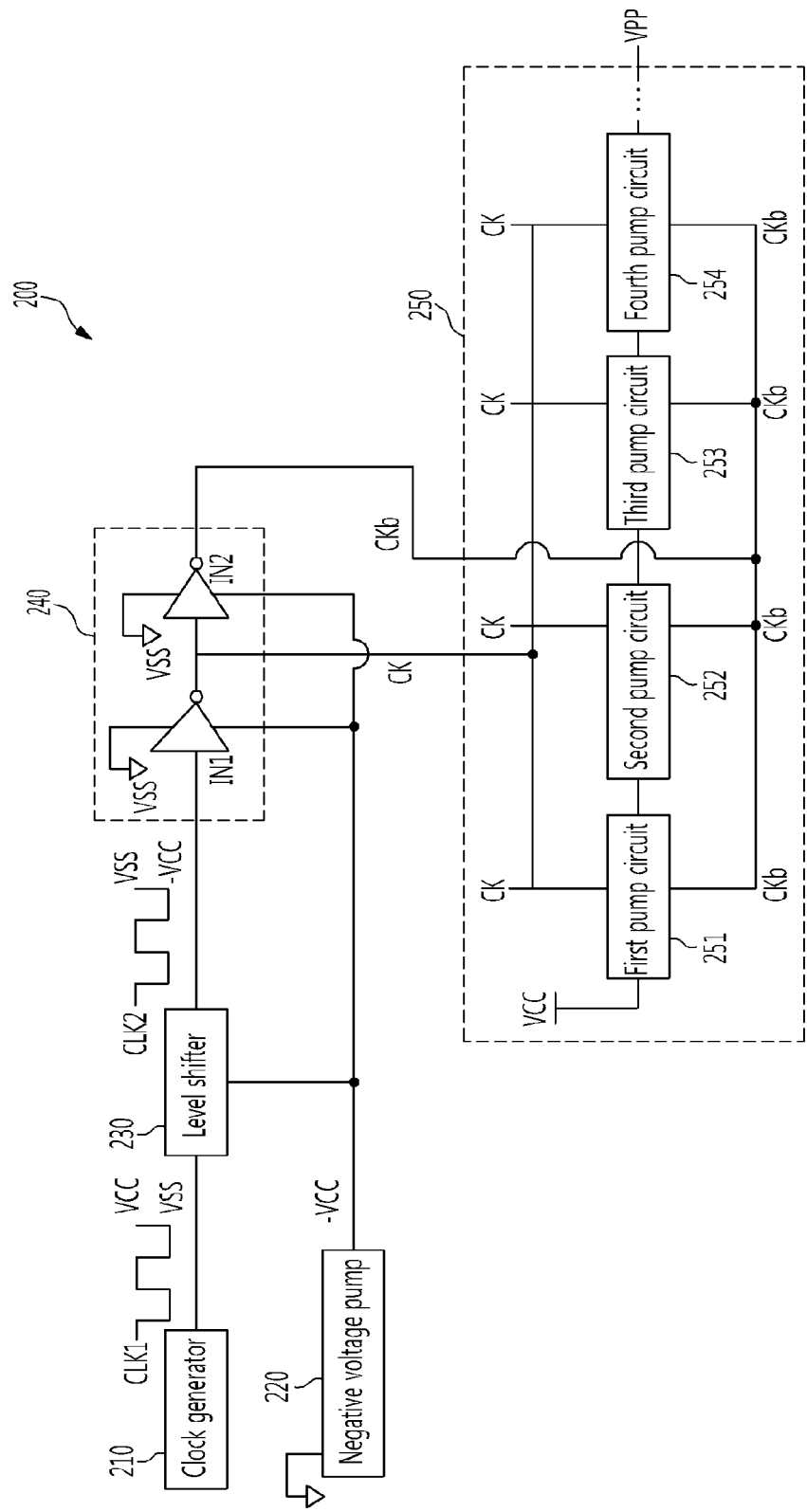
FIG. 2 shows a voltage supply circuit according to an embodiment of the present invention.

FIG. 2 shows a voltage supply circuit 200 according to an embodiment of the present invention.

Referring to FIG. 2, the voltage supply circuit 200 according to an embodiment of the present invention includes, inter alia, a clock generator 210, a negative voltage pump 220, a level shifter 230, a clock controller 240, and a pump group 250.

The clock generator 210 generates a first clock signal CLK1 outputted in a pulse form between two voltages, for example, between a power source voltage VCC and a ground voltage VSS.

The negative voltage pump 220 generates a negative voltage, for example, the negative equivalent of the power source voltage −VCC. The voltages VCC, −VCC, and VSS will be referred to in describing an embodiment of the present invention below with respect to FIG. 2 although it should be readily understood that other voltage levels are also possible.

The level shifter 230 shifts the voltage level of the first clock signal CLK1 received from the clock generator 210 to a level between the ground voltage VSS and the negative voltage −VCC by using the negative voltage −VCC of the negative voltage pump 220. The output of the level shifter 230 is a second clock signal CLK2.

The clock controller 240 generates third and fourth clock signals CK and CKb by using the second clock signal CLK2. The third and fourth clock signals CK and CKb have opposite phases. Furthermore, each of the third and fourth clock signals CK and CKb is similar to the second clock signal CLK2 in that the amplitude of a pulse is the power source voltage VCC, but has a pulse form between the ground voltage VSS and the negative voltage −VCC. Accordingly, a voltage difference between the third and fourth clock CK and CKb inputted to the pump group 250 is the same as the existing clock having a pulse form between 0 V and the power source voltage VCC. Accordingly, the voltage difference does not have an effect on the pumping operation of the pump group 250.

The clock controller 240 includes first and second inverters IN1 and IN2. The first and second inverters IN1 and IN2 invert the voltage levels of the input signals so that the input signals are pulled up or pulled down to the ground voltage VSS and the negative voltage −VCC.

The first inverter IN1 outputs the third clock signal CK, and the second inverter IN2 outputs the fourth clock signal CKb.

The first and second inverters IN1 and IN2 will be described later.

The pump group 250 generates a high voltage VPP by pumping the power source voltage VCC in response to the third and fourth clock signals CK and CKb.

The pump group 250 includes a plurality of pump circuits, for example, the first to fourth pump circuits 251 to 254 shown in FIG. 2. The plurality of first to fourth pump circuits 251 to 254 is coupled in series.

The plurality of first to fourth pump circuits 251 to 254 of the pump group 250 pump the respective input voltages in response to the third and fourth clock signals CK and CKb and output the respective pumped voltages.

The first pump circuit 251 receives the power source voltage VCC and outputs a pumped voltage, and each of the remaining pump circuits 252 to 253 pumps the pumped voltage received from the prior pump circuit in the series and outputs it as an input voltage to the next pump circuit in the series. The last pump circuit 254 in the series pumps the output voltage of the pump circuit 253 and outputs the pumped voltage as the high voltage VPP.

The voltage outputted from the last pump circuit 254 is the high voltage VPP.

The first and second inverters IN1 and IN2 for generating the third and fourth clock signals CK and CKb are configured to maintain the negative voltage −VCC.

The first inverter IN1 and the second inverter IN2 may have same structure, and the first inverter IN1 is described below as an example.

Figure 3A:
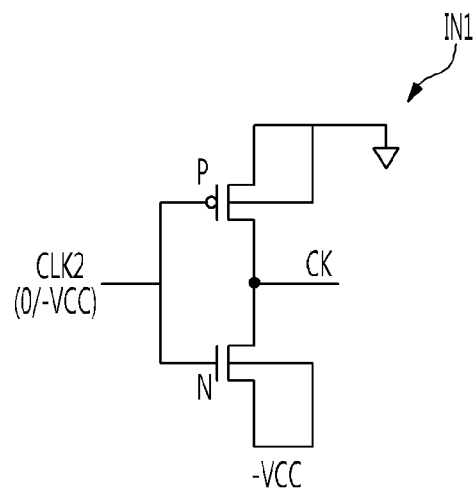
FIGS. 3A and 3B show the structure of a first inverter.
Figure 3B:
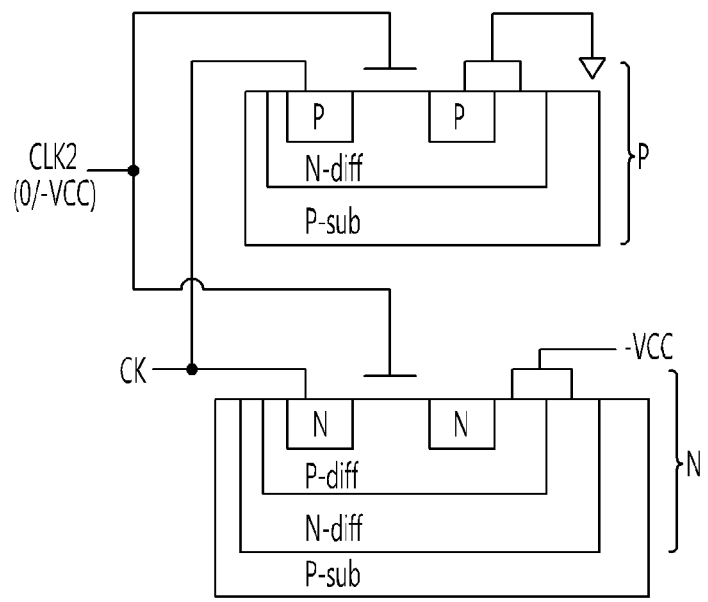

FIGS. 3A and 3B show the structure of the first inverter IN1 according to an embodiment of the present invention.

FIG. 3A shows an equivalent circuit of the first inverter IN1 comprising a PMOS transistor P and an NMOS transistor N.

The PMOS transistor P and the NMOS transistor N are coupled in series between the ground voltage VSS (e.g., 0 V) and the negative voltage −VCC from the negative voltage pump 220 of FIG. 2.

Furthermore, the second clock signal CLK2 is inputted to the gates of the PMOS transistor P and the NMOS transistor N, and the third clock signal CK is outputted from a node of the PMOS transistor P and the NMOS transistor N.

The third clock signal CK is inputted to the second inverter IN2 (which may have the same structure as the first inventor IN1 as shown in FIG. 3A), and the output of the second inverter IN2 is the fourth clock signal CKb.

The operations of the PMOS transistor P and the NMOS transistor N must not be influenced by the negative voltage −VCC.

The PMOS transistor P and the NMOS transistor N may be fabricated as shown in FIG. 3B.

Referring to FIG. 3B, the PMOS transistor P has a structure in which an N well N-diff is formed in a P type substrate P-sub, and a P type junction is formed in the N well N-diff.

The NMOS transistor N has a triple well structure in which an N well N-diff is formed in a P type substrate P-sub, and a P well P-diff is formed on the N well N-diff. The NMOS transistor N forms a junction on the P well. Accordingly, the NMOS transistor N is not influenced by the leakage current flowing through the well and the breakage voltage in the junction.

The N well and the P well can maintain the negative voltage −VCC.

That is, the NMOS transistor N of the first inverter IN1 maintains the negative voltage −VCC inputted to the source of the NMOS transistor N, and thus the first inverter IN1 can output the third clock signal CK in a pulse form between the negative voltage −VCC and 0 V.

Consequently, the external current for providing the power source voltage VCC is not required, in contrast with a conventional inverter operated between 0 V and the power source voltage VCC, which would require an external current.

The second inverter IN2 has the same construction as the first inverter IN1.

Accordingly, the voltage supply circuit 200 according to an embodiment of the present invention consume current for charging and discharging the capacitors of the pump group 250, but the first and second inverters IN1 and IN2 do not consume current needed for supplying the power source voltage VCC.

Figure 4:
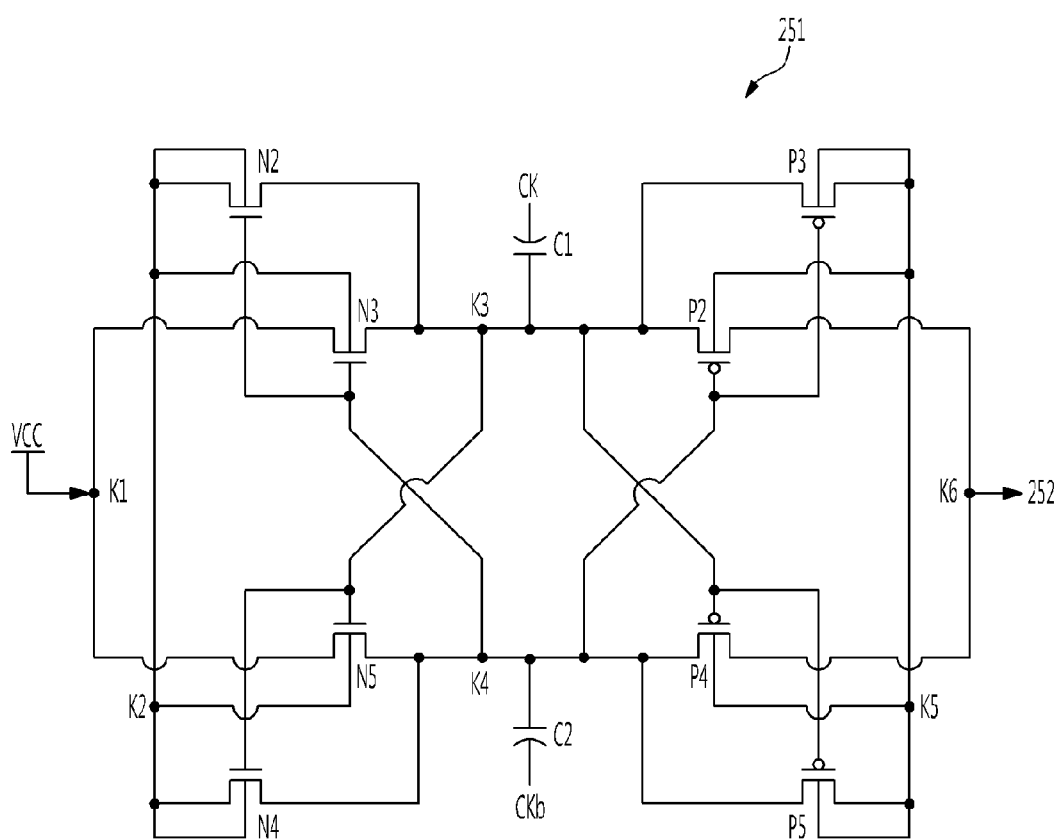
FIG. 4 shows a first pump circuit of FIG. 2.

FIG. 4 shows the first pump circuit 121 of FIG. 2 according to an embodiment of the present invention.

The first pump circuit 251 of the first fourth pump circuits 251 to 254 of the pump group 250 of FIG. 2 is described as an example.

Referring to FIG. 4, the first pump circuit 251 includes second to fifth NMOS transistors N2 to N5, second to fifth PMOS transistors P2 to P5, and first and second capacitors C1 and C2.

The power source voltage VCC is inputted to a node K1 in the case of the first pump circuit 251, and the voltage outputted from a previous pump circuit is inputted to the node K1 of each of the remaining pump circuits 252 to 254.

The second NMOS transistor N2 is coupled between a node K2 and a node K3, and the third NMOS transistor N3 is coupled between the node K1 and the node K3.

The gates of the second and third NMOS transistors N2 and N3 are coupled to a node K4.

The well of the second and third NMOS transistors N2 and N3 is coupled to the node K2.

The fourth NMOS transistor N4 is coupled between the node K2 and the node K4, and the fifth NMOS transistor N5 is coupled between the node K1 and the node K4.

The gates of the fourth and the fifth NMOS transistors N4 and N5 are coupled to the node K3. The well of the fourth and the fifth NMOS transistors N4 and N5 is coupled to the node K2.

The second PMOS transistor P2 is coupled between the node K3 and a node K6, and the third PMOS transistor P3 is coupled between the node K3 and a node K5.

The gates of the second and third PMOS transistors P2 and P3 are coupled to the node K4, and the well of the second and third PMOS transistors P2 and P3 is coupled to the node K5.

The fourth PMOS transistor P4 is coupled between the node K4 and the node K6, and the fifth PMOS transistor P5 coupled between the node K4 and the node K5.

The gates of the fourth and the fifth PMOS transistors P4 and P5 are coupled to the node K3, and the well of the fourth and the fifth PMOS transistors P4 and P5 is coupled to the node K5.

The pumping voltage of the first pump circuit 251 is outputted to the node K6. The pumping voltage of the node K6 is inputted to the second pump circuit 252.

The first capacitor C1 is coupled between the node K3 and an input terminal to which the third clock signal CK is inputted. The second capacitor C2 is coupled between the node K4 and an input terminal to which the fourth clock signal CKb is inputted.

Each of the pump circuit has a cross-coupled structure.

The second and the fourth NMOS transistors N2 and N4 and the third and the fifth PMOS transistors P3 and P5 function to make constant the well voltages of the third and the fifth NMOS transistors N3 and N5 and the second and the fourth PMOS transistors P2 and P4.

The third and the fifth NMOS transistors N3 and N5 and the second and the fourth PMOS transistors P2 and P4 function to pump voltage, received from a previous pump circuit, and output the pumped voltage to a next stage.

The pump circuit pumps voltage while charging and discharging the first and second capacitors C1 and C2 by using the third and fourth clock signals CK and CKb.

Furthermore, as described above, the first and second inverters IN1 and IN2 according to an embodiment of the present invention output the third and fourth clock signals CK and CKb, each of which is a pulse signal between 0 V and the negative voltage −VCC.

Accordingly, the overall current consumption can be reduced because the first and second inverters IN1 and IN2 of the voltage supply circuit 200 do not consume current that would be needed in order to supply the power source voltage VCC.

As described above, the voltage supply circuit and method according to the embodiment of this disclosure can reduce overall consumption current because current consumed by the circuit for generating the clock signal to control the pump circuit is reduced.

What is claimed is:

1. A voltage supply circuit, comprising:
    a level shifter configured to receive a negative voltage and a first clock swinging between a positive voltage and a ground voltage and to generate a second clock swinging between the negative voltage and the ground voltage by shifting the first clock to the negative voltage;
    a clock controller configured to generate third and fourth clocks, wherein the third clock is generated by inverting the second clock and the fourth clock is generated by inverting the third clock; and
    a pump circuit for generating a high voltage according to the third and fourth clocks,
    wherein the absolute value magnitude of the positive voltage and the ground voltage substantially equals the absolute value magnitude of the negative voltage and the ground voltage.

2. The voltage supply circuit of claim 1, further comprising a clock generator configured to generate the first clock.

3. The voltage supply circuit of claim 1, further comprising a negative voltage pump configured to generate the negative voltage.

4. The voltage supply circuit of claim 1, wherein the clock controller comprises:
    a first inverter configured to generate the third clock by inverting the second clock; and
    a second inverter configured to generate the fourth clock by inverting the third clock.

5. The voltage supply circuit of claim 4, wherein each of the first and second inverters comprises:
    a PMOS transistor; and
    an NMOS transistor having a triple well structure, wherein the PMOS and NMOS transistors are coupled to each other in series between the ground voltage and the negative voltage.

6. The voltage supply circuit of claim 5, wherein:
    the triple well structure of the NMOS transistor comprises a substrate, an N well in the substrate, and a P well in the N well, and
    the negative voltage is provided to the P well and the N well.

7. The voltage supply circuit of claim 1, wherein the pump circuit configured in a cross-coupled pump structure comprises a capacitor charged or discharged according to the third and fourth clocks.

8. A voltage supply method, comprising:
    level shifting a first clock swinging between a positive voltage and a ground node by a predetermined negative voltage so as to output a second clock swinging between a ground voltage and the predetermined negative voltage;
    inverting the second clock so as to output the third clock; and
    pumping an input voltage using the second and the third clocks so as to output a pumped voltage,
    wherein the absolute value magnitude of the negative voltage is predetermined to be substantially identical to the absolute value magnitude of the power source voltage.

* * * * *